(12) United States Patent
Wittig et al.

(10) Patent No.: US 6,388,466 B1
(45) Date of Patent: May 14, 2002

(54) FPGA LOGIC ELEMENT WITH VARIABLE-LENGTH SHIFT REGISTER CAPABILITY

(75) Inventors: Ralph D. Wittig, Menlo Park; Sundararajarao Mohan, Sunnyvale; Bernard J. New, Los Gatos, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/844,042

(22) Filed: Apr. 27, 2001

(51) Int. Cl.$^7$ ............................................. H03K 19/177
(52) U.S. Cl. ........................................... 326/40; 326/41
(58) Field of Search ...................... 326/37–41

(56) References Cited

U.S. PATENT DOCUMENTS

| | | | |
|---|---|---|---|
| 4,821,233 A | | 4/1989 | Hsieh |
| 5,343,406 A | | 8/1994 | Freeman et al. |
| 5,349,250 A | | 9/1994 | New |
| 5,889,413 A | * | 3/1999 | Bauer ........................... 326/40 |
| 5,920,202 A | | 7/1999 | Young et al. |
| 6,118,298 A | | 9/2000 | Bauer |
| 6,118,707 A | * | 9/2000 | Gould et al. ........... 365/189.08 |
| 6,150,838 A | | 11/2000 | Wittig et al. |

OTHER PUBLICATIONS

"The Programmable Logic Data Book", 1998, available from Xilinx, Inc. 2100 Logic Drive, San Jose, CA 95124, pp. 4–9 to 4–21.

"The Programmable Logic Data Book", Sep. 1996, available from Xilinx, Inc., 2100 Logic Drive, San Jose, CA 95124, pp. 4–188 to 4–190.

"The Programmable Logic Data Book 2000", published in 2000, available from Xilinx, Inc., 2100 Logic Drive, San Jose, CA 95124, pp. 3–79 to 3–82.

* cited by examiner

Primary Examiner—Michael Tokar
Assistant Examiner—V. Tan
(74) Attorney, Agent, or Firm—Lois D. Cartier

(57) ABSTRACT

A logic element for a programmable logic device (PLD) can be configured as a shift register of variable length. An array of memory cells in the logic element is divided into two or more portions. The memory cells of each portion supply values to a corresponding output multiplexing circuit, thereby enabling the logic element to function as a lookup table by combining the outputs of the multiplexing circuits. However, each portion is also configurable as a shift register. The portions can function as separate shift registers, or can be concatenated to function as a single shift register. In some embodiments, the portions can also be concatenated with shift registers in other logic elements. Because two or more output multiplexing circuits are available, two or more taps are provided, one from each portion of the memory array.

30 Claims, 12 Drawing Sheets

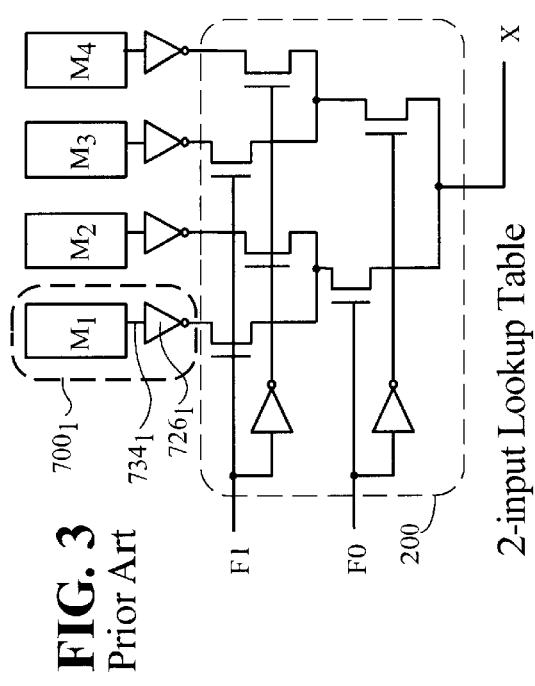
FIG. 3
Prior Art
2-input Lookup Table
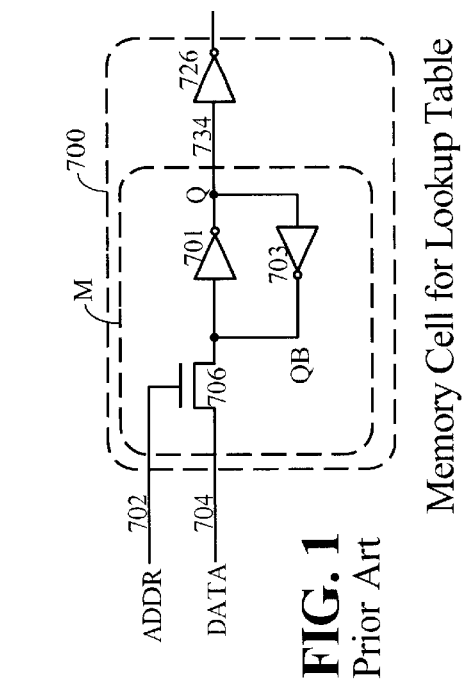
FIG. 1
Prior Art
Memory Cell for Lookup Table
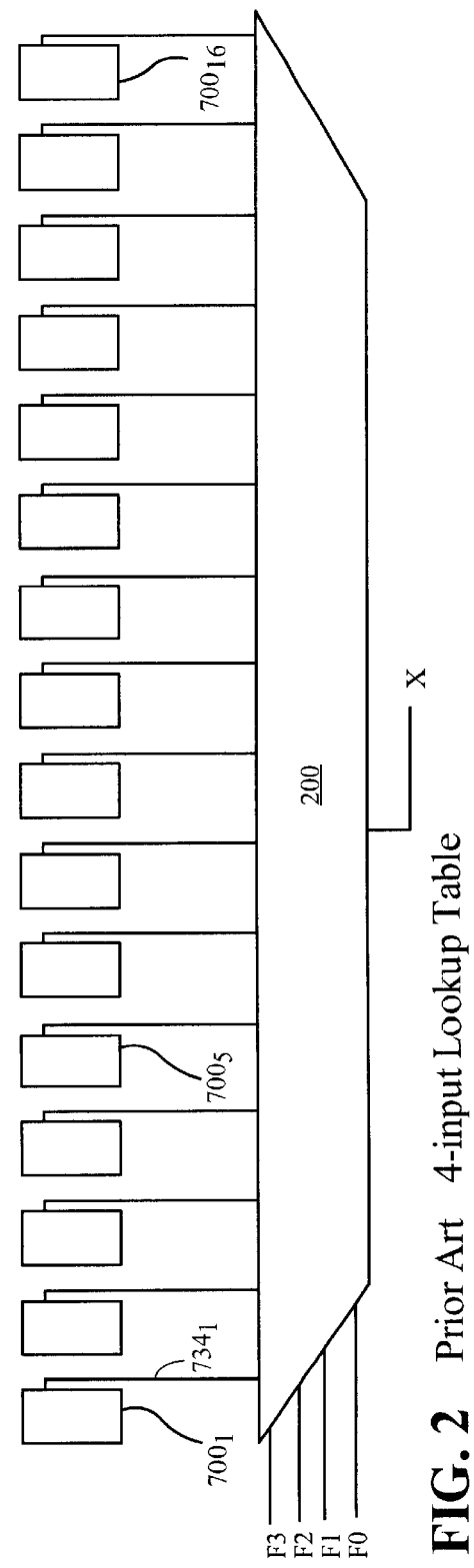
FIG. 2 Prior Art 4-input Lookup Table

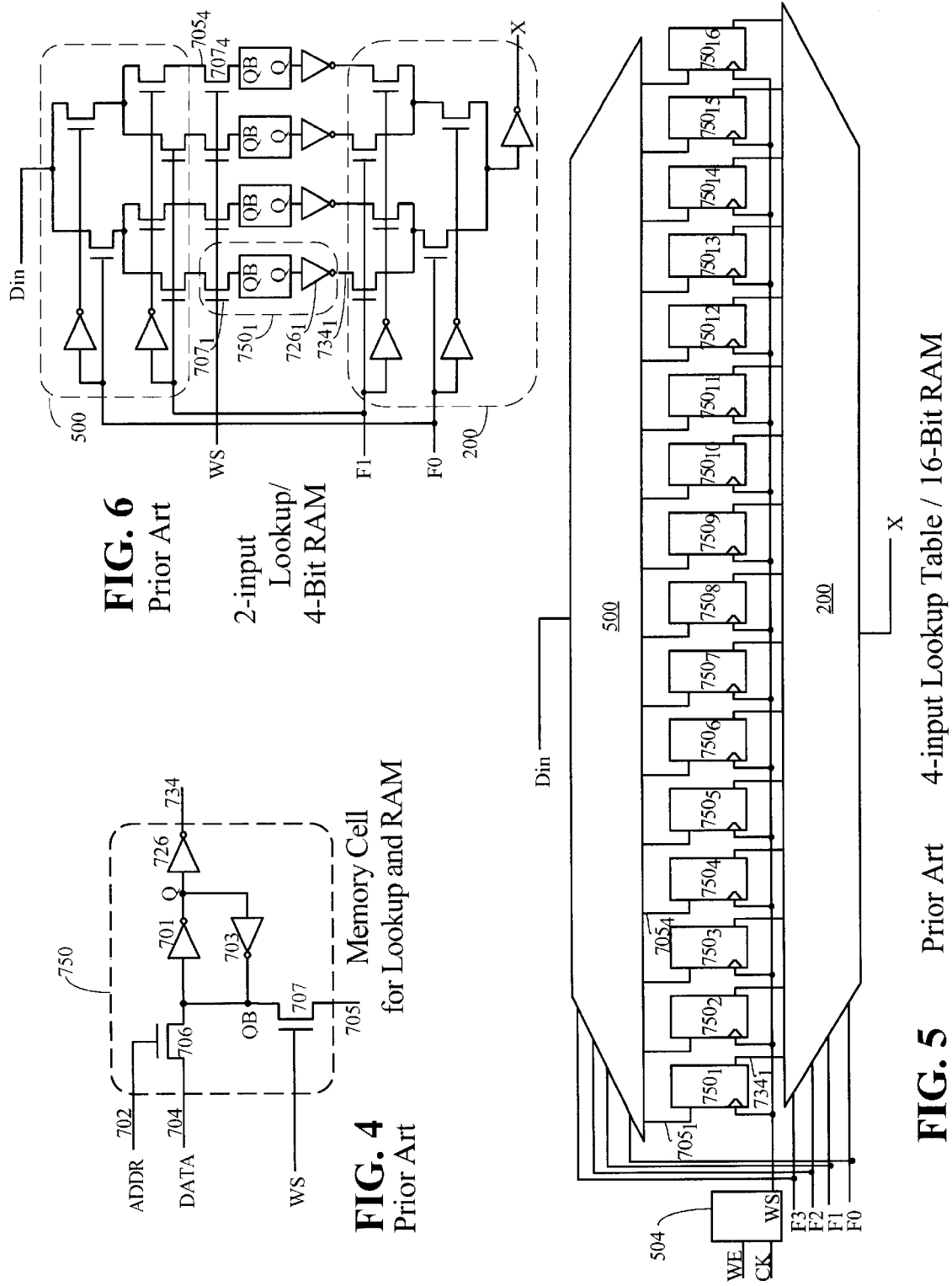
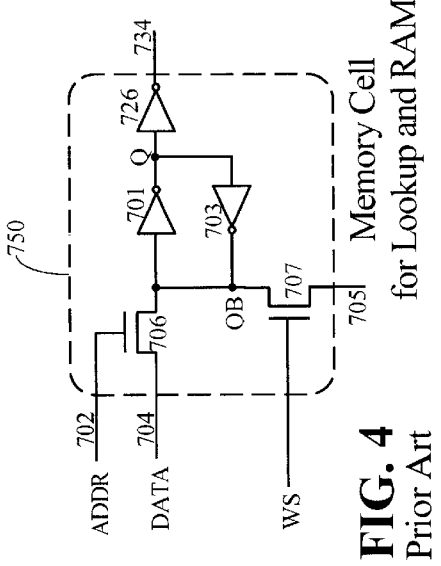
FIG. 4 Prior Art
Memory Cell for Lookup and RAM
FIG. 6 Prior Art
2-input Lookup / 4-Bit RAM
FIG. 5 Prior Art
4-input Lookup Table / 16-Bit RAM 2-input Lookup / 4-Bit Shift Memory Cell for Lookup and Shift 4-input Lookup Table / 16-Bit Shift Register Memory Cell for Lookup/Shift Bit/RAM Bit 2-input LUT/
4-Bit Shift/
4-Bit RAM

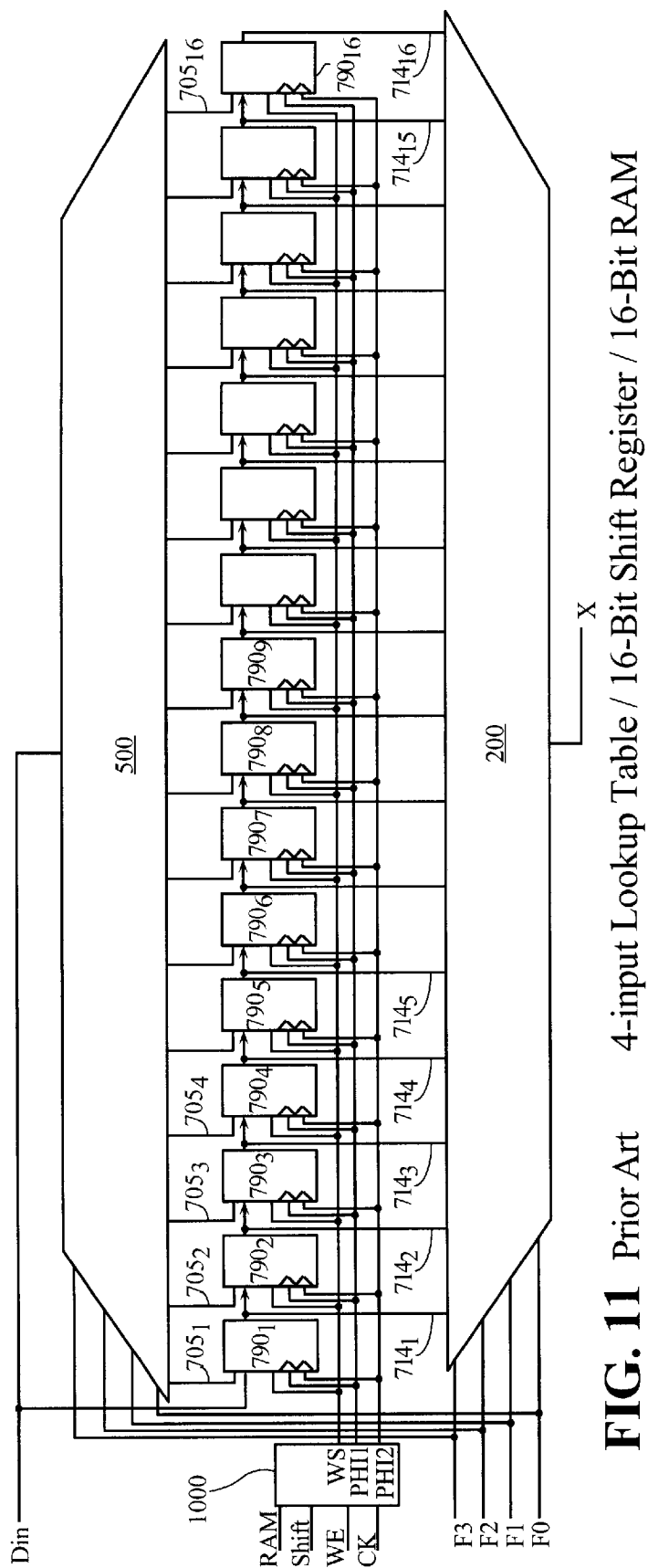
FIG. 11 Prior Art    4-input Lookup Table / 16-Bit Shift Register / 16-Bit RAM ize: medium"># FPGA LOGIC ELEMENT WITH VARIABLE-LENGTH SHIFT REGISTER CAPABILITY

FIELD OF THE INVENTION

The invention relates to Programmable Logic Devices (PLDS) such as Field Programmable Gate Arrays (FPGAs). More particularly, the invention relates to an FPGA logic element having variable-length shift register capability.

BACKGROUND OF THE INVENTION

Programmable logic devices (PLDs) are a well-known type of digital integrated circuit that may be programmed by a user to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a programmable interconnect structure. The CLBs, IOBs, and interconnect lines are typically programmed by loading a stream of configuration data (bitstream) into internal configuration memory cells that define how the CLBs, IOBs, and interconnect are configured. The configuration data may be read from memory (e.g., an external PROM) or written into the FPGA by an external device. The collective states of the individual memory cells then determine the function of the FPGA.

CLBs typically include both logic elements and storage elements (e.g., flip-flops). Each logic element implements a logic function of the n inputs to the logic element according to how the logic element has been configured. Logic functions may use all n inputs to the logic element or may use only a subset thereof. A few of the possible logic functions that a logic element can be configured to implement are: AND, OR, XOR, NAND, NOR, XNOR and mixed combinations of these functions.

One known implementation of the logic element includes a configurable lookup table that is internal to the logic element. This lookup table includes $2^n$ individual memory cells, where n is the number of input signals the lookup table can handle. At configuration, in this architecture a bitstream programs the individual memory cells of the lookup table with a desired function by writing the truth table of the desired function to the individual memory cells.

One memory cell architecture appropriate for use in the lookup tables is shown in FIG. 1 and described by Hsieh in U.S. Pat. No. 4,821,233. A memory cell of this architecture is programmed by applying the value to be written to the memory cell on the data input line DATA and strobing the corresponding address line ADDR. Further, although memory cell M is implemented using five transistors, other known configurations, e.g., six transistor static memory cells, also are appropriate choices for implementing the memory cells of the lookup table. As shown in FIG. 1, inverter 726 may be included to increase the drive of memory cell 700, and avoid affecting the value stored in memory cell 700 unintentionally via charge sharing with the read decoder.

After configuration, to use a lookup table, the input lines of the configured logic element act as address lines that select a corresponding memory cell in the lookup table. For example, a logic element configured to implement a two-input NAND gate provides the corresponding value {1,1,1, 0} contained in the one of the four memory cells corresponding to the current input pair {00, 01, 10, 11}, respectively. The selection of the memory cell to be read is performed by a decoding multiplexer, which selects a memory cell from the lookup table on the basis of the logic levels on the input lines.

FIG. 2 shows a block diagram of an exemplary 4-input lookup table including 16 memory cells $700_1$ through $700_{16}$ and a decoding multiplexer 200. Multiplexer 200 propagates a value stored in exactly one of the memory cells $700_1$–$700_{16}$ of the lookup table to an output X of the lookup table as selected by the four input signals F0–F3. (In the present specification, the same reference characters are used to refer to terminals, signal lines, and their corresponding signals.)

FIG. 3 is a schematic diagram of a known 2-input lookup table. This lookup table is implemented using four memory cells $700_1$–$700_{44}$ and a two-input decoding multiplexer 200 with two input signals, F0 and F1. The two-input decoding multiplexer 200 is shown in detail as being implemented by a hierarchy of pass transistors, which propagate the value stored in the selected memory cell to the output X of the logic element. In FIG. 3, the memory cells can be implemented, for example, as shown in FIG. 1.

The above architecture was later augmented to enhance the functionality of the lookup tables. Freeman et al., in U.S. Pat. No. 5,343,406, describe how additional circuitry can enable lookup tables to behave as random access memories (RAMs) that can be both read and written after configuration of the logic device. When the option of allowing the user to write data to memory cells is available, there also must be provision for entering the user's data into these memory cells and reading from the memory cells. This capability is provided by including two means for accessing each dual function memory cell, one of which is used to supply the configuration bitstream from off the chip, and the other of which is used during operation to store values from signals that are routed from the interconnect lines of the FPGA.

FIG. 4 shows the memory cell architecture described by Freeman et al. in U.S. Pat. No. 5,343,406, which allows memory cell 750 to be programmed both during and after configuration. During configuration, memory cell 750 is programmed using the same process for programming the memory cell of FIG. 1. After configuration, memory cell 750 is programmed differently. A value to be written to memory cell 750 is applied through the interconnect structure of the FPGA to the second data line 705, and then the corresponding write-strobe line WS for the memory cell is pulsed. This pulse latches the value on line 705 into memory cell 750. Like the lookup table of FIG. 2, which uses a series of memory cells from FIG. 1, a series of memory cells from FIG. 4 are combinable into a lookup table. The resulting lookup table can also be optionally used as a RAM after the conclusion of the configuration process.

FIG. 5 is a block diagram showing a 4-input lookup table with synchronous write capability. The lookup table of FIG. 5 includes a write strobe generator 504 that receives a clock signal CK and a write enable signal WE, and creates a single write strobe signal WS for the lookup table. To write a value to a desired memory cell, for example memory cell $750_5$, the value is applied on line $D_{in}$ and the address of the desired memory cell $750_5$ is applied to the input lines F0–F3 of demultiplexer 500. The value is then latched into the desired memory cell $750_5$ by pulsing the write strobe signal WS. Conversely, to read a value stored in a different desired memory cell $750_3$, the address of the memory cell $750_3$ is applied to the input lines F0–F3 of decoding multiplexer 200 (without pulsing the write strobe), as was described with reference to FIGS. 2 and 3.

FIG. 6 is a schematic illustration of a 2-input lookup table with synchronous write capability. The lookup table of FIG.

6 includes four memory cells $750_1$ through $750_4$. Details of demultiplexer 500 and multiplexer 200 are shown in FIG. 6.

One or more 4-input lookup tables, such as those illustrated in FIGS. 2 and 5, are typically used to implement combinatorial function generators in a CLB. Because a 4-input lookup table is only capable of storing 16 bits of data, CLE architectures have been designed that allow the combination of two lookup tables to form larger structures. For example, some CLBs include a third function generator selecting between the outputs of two 4-input lookup tables, which enables the CLB to implement any 5-input function. One such CLB, implemented in the Xilinx XC4000-Series FPGAs, is described in pages 4–9 through 4–21 of the Xilinx 1998 Data Book entitled "The Programmable Logic Data Book 1998", published in 1998 and available from Xilinx, Inc., 2100 Logic Drive, San Jose, Calif. 95124. (Xilinx, Inc., owner of the copyright, has no objection to copying these and other pages referenced herein but otherwise reserves all copyright rights whatsoever.)

The third function generator can be replaced by a 2-to-1 multiplexer with a signal selecting between the outputs of the two 4-input lookup tables, as disclosed in U.S. Pat. No. 5,349,250 entitled "Logic Structure and Circuit for Fast Carry" by Bernard J. New. Replacing the third function generator with a 2-to-1 multiplexer still provides any function of up to five inputs, and uses less silicon area than a third function generator. One FPGA using two 4-input lookup tables and a 2-to-1 multiplexer to implement a 5-input function generator is the XC5200™ family of FPGAs from Xilinx, Inc. The XC5200 CLB is described in pages 4–188 through 4–190 of the Xilinx 1996 Data Book entitled "The Programmable Logic Data Book", published in July of 1996 and available from Xilinx, Inc.

A configurable logic block (CLB) capable of generating 6-input functions is described by Young et al. in U.S. Pat. No. 5,920,202 and implemented in the Virtex® family of FPGAs from Xilinx, Inc. The outputs of four 4-input function generators are combined in pairs using two 2-input multiplexers, then the outputs of the two 2-input multiplexers are combined using a third 2-input multiplexer. The Virtex CLB is described in pages 3–79 to 3–82 of the Xilinx 2000 Data Book entitled "The Programmable Logic Data Book 2000", published in 2000 and available from Xilinx, Inc.

While 6-input functions are useful, it is even more desirable to have the ability to efficiently implement functions with any number of inputs. Bauer et al. describe a lookup table having such abilities in U.S. Pat. No. 6,118,298, entitled "Structure for Optionally Cascading Shift Registers". Bauer's lookup table, shown in FIGS. 7–9, is configurable as both a ($\log_2 n$)-input lookup table and an n-bit cascadable shift register.

FIG. 7 shows a schematic illustration of a memory cell $770_2$ of Bauer's lookup table. When configured in shift register mode, a value can be shifted from a preceding memory cell $770_1$ into memory cell $770_2$. Memory cell $770_2$ includes a pass transistor 706. The configuration value is written into memory cell $770_2$ by pulsing configuration control line 702 of transistor 706, while applying the configuration value to the data line 704. The output of memory cell $770_2$ is programmably connected to the input of a next memory cell $770_3$ by pass transistor $720_2$, inverter $726_2$, and a next pass transistor $708_3$ not shown in FIG. 7. As explained in detail by Bauer, by using non-overlapping two-phase clocking on clock lines PHI1 and PHI2, the memory cells shift one bit from left to right for every clock cycle.

FIG. 8 shows a logic element that implements a 16-bit shift register and 4-input lookup table as shown and described by Bauer. For simplicity, in FIG. 8 the structures within memory cells 770 of FIG. 7 have not been explicitly illustrated. In FIG. 8, when in shift register mode, a first memory cell $770_1$ of the memory is programmed with an initial value. The memory cell's value may be overwritten with a new value by applying the new value to the $D_{in}$ terminal of the first memory cell $770_1$ and strobing the clock line, CK. The strobing of CK in turn invokes a two-phase clocking cycle on non-overlapping two-phase clock signals PHI1 and PHI2 (generated by clock generator 800). As data is moved synchronously from left to right in the shift register, i.e., from the first memory cell $700_1$ to a last memory cell $700_{16}$, the logic element can continue to act as a lookup table, although the function changes with every clock cycle. The decoding multiplexer 200 provides on output line X the contents of the memory cell selected by the user inputs F0–F3.

FIG. 9 shows a structure for implementing a 2-input lookup table or a 4-bit shift register, and shows the internal structure of multiplexer 200 and memory cells $770_1$ through $770_4$. FIG. 9 is oriented on the page the same way as FIG. 8, and thus assists in understanding the relationship between the elements that make up the lookup table/shift register logic element.

Bauer also showed and described a logic element configurable as an n-bit shift register, an n-bit random access memory, and a ($\log_2$ n)-input lookup table. FIGS. 10–12 illustrate this logic element. FIG. 10 illustrates the memory cell. The memory cell of FIG. 10 can be loaded from three different sources. During configuration, memory cell $790_2$ is loaded by applying configuration data to line 704 and strobing control line 702 of transistor 706. When memory cell $790_2$ is in shift register mode, it is loaded through transistor 708, as discussed above. When memory cell $790_2$ is in RAM mode, it is loaded through demultiplexer 500 on line $705_2$. Write strobe line WS is pulsed, turning on transistor 707, and thus applying a data signal to node 730.

FIG. 11 shows a logic element that implements any one of a 16-bit shift register, a 16-bit random access memory, and a 4-input lookup table, as shown and described by Bauer. In this logic element, a memory cell $790_5$ of the lookup table is programmed with an initial value during configuration, as discussed above. Subsequently, the initial value may be replaced in either of two ways, depending on the mode of the logic element: shift or RAM. When the lookup table including memory cells 790 is being used in RAM mode, each memory cell 790 receives its data input on RAM input line 705. To write to any memory cell 790, the write strobe line WS pulses, thereby driving the value of Din through demultiplexer 500 into the addressed memory cell via input line 730.

The operation of the logic element in each of these modes is controlled by control logic 1000. Control bits that specify whether the logic element is in RAM mode, shift mode, or neither (RAM, Shift) are provided to control logic unit 1000. Control logic unit 1000 also receives the user clock signal CK and the write enable signal WE. From these inputs, control logic unit 1000 outputs PHI1, PHI2 and write strobe signal WS to either shift data between memory cells, to write to a particular memory cell, or to leave the memory cell data untouched. When in shift register mode, as in the logic element of FIG. 8, data is moved synchronously from left to right in the shift register, i.e., from the first memory cell $790_1$ to a last memory cell $790_{16}$, as described above, by invoking a two-phase clocking cycle when CK is strobed. On the other hand, when the logic element is configured as a random access memory (RAM), the addressing lines F0–F3 select one of the memory cells ($790_1$ through $790_{16}$) to be written to and read from by using the demultiplexer 500 and the decoding multiplexer 200, respectively. When in shift register mode, the first memory cell $790_1$ receives as its input the signal applied to line $D_{in}$. When in RAM mode, memory cell $790_1$ receives an input signal on line $705_1$ from demultiplexer 500.

In RAM mode, to write to a given memory cell, say $700_5$, the write enable line WE must be active. When the user clock signal CK is asserted in conjunction with the active WE signal, control logic unit 1000 generates a write strobe WS. When the write strobe WS is high, memory cell $700_5$ addressed by address lines F0–F3 of the demultiplexer 500 receives the value from data input line $D_{in}$. This value overwrites the previous contents of the memory cell $700_5$. No other memory cells receive the value applied to $D_{in}$ since they are not addressed and therefore are separated from $D_{in}$ by high impedance connections from the demultiplexer 500.

FIG. 12 is a schematic illustration showing more detail of a lookup table/shift/RAM logic element as shown and described by Bauer. Collectively, demultiplexer 500, decoding multiplexer 200, pass transistors 708 and 720, inverters 726, and RAM mode pass transistors 707 form an interconnection network and are combined with memory cells ($790_1$ through $790_4$) and control logic unit 1000 to implement the logic element. If the logic element is not configured as a shift register, then the logic element acts as either a random access memory or a lookup table. In either non-shift register mode, PHI2 is maintained at a low level, deactivating pass transistors 708, thereby blocking data from one memory cell $790_i$ from affecting the next memory cell $790_{i+1}$. Also, in the non-shift register modes PHI1 is maintained at a high logic level, thereby feeding the outputs of the memory cells ($790_1$ to $790_4$) through to the decoding multiplexer 200. As in the previous examples, the output of the logic element is selected by the decoding multiplexer 200 according to the user inputs F0 and F1.

When the logic element of FIG. 12 is configured as a shift register, the RAM mode pass transistors 707 are turned off because WS is held low, isolating the memory cells from the outputs of demultiplexer 500. Memory cell $790_1$ is programmably connected to $D_{in}$, through transistor $708_1$. To shift values, control logic unit 1000 produces control signals PHI1 and PHI2, triggered while the write enable signal WE is active by a rising edge of the user clock signal CK applied to control logic unit 1000, such that values are shifted from one memory cell to the next memory cell, i.e., from memory cell $790_{i-1}$ to memory cell $790_i$, and from memory cell $790_i$ to memory cell $790_{i+1}$. When control logic unit 1000 receives a rising edge of the user clock signal CK, control logic unit 1000 first pulls PHI1 low, then pulses PHI2 high long enough to overwrite the contents of the memory cells ($790_1$ to $790_4$), and lastly reasserts PHI1 after PHI2 has fallen. It is important for extremely low clocking frequencies that PHI2 be only a pulse since PHI1 must be off while PHI2 is on. To accomplish this goal, the control logic is designed so that PHI1 and PHI2 do not rely on the falling edge of the user clock signal CK, but are self-timed.

Bauer also shows various circuits that can be implemented using the configurable logic elements shown in FIGS. 7–12. For example, Bauer creates shift registers larger than 16 bits by concatenating the 16-bit shift registers of FIGS. 8 and 11. To implement these larger shift registers, Bauer's structure provides a configurable connection between the output of a shift register in one logic element and the input to the shift register in the next logic element.

FIG. 13 is a block diagram of a logic element having such a configurable connection. Sixteen memory cells 0–15 are serially coupled to form a 16-bit shift register shifting from bit 0 to bit 15, with the shift register output being provided on a logic element output terminal S_OUT. The shift function timing is controlled by control circuit 800, which is similar to control circuit 800 of FIG. 8. Multiplexer 201 provides either the shift register output from the previous logic element (S_IN) or a user input value (FEED) to the input terminal of memory cell 0. Multiplexer 201 is controlled by a configurable memory cell 202. Each memory cell 0–15 provides one bit to a multiplexer 200, which selects one of these bits under control of user input signals F0–F3, and provides the selected bit value to output terminal X of the logic element.

As noted by Bauer, a shift register having fewer stages than the number of memory cells in a lookup table can be formed by directing a bit other than the last bit to output terminal X. For example, the dotted line in FIG. 13 shows the output of memory cell 7 being directed to output terminal X, by appropriate selection of user input signals F0–F3. In this configuration, the logic element forms an 8-bit shift register. If desired, the signal on output terminal x (e.g., bit 7) can then be directed to user input FEED of another logic element, to extend the shift register. However, note that when Bauer's structure is used, only one shift register can be implemented in a single logic element. Therefore, two 16-bit logic elements are required to implement two 8-bit shift registers, with 8 bits in each logic element being unused.

Therefore, it is desirable to provide a logic element having configurable shift register capability, wherein shift registers of variable length are easily and efficiently implemented. It is further desirable to provide a logic element that can be used to implement two or more shift registers.

Shift registers are often used when implementing filters and cyclic redundancy check (CRC) circuits. In such designs, it is often necessary to "tap" certain bits in the shift register. A shift register "tap" is a path by which a single bit from the shift register can be read without affecting the flow of data through the shift register. Using Bauer's shift register, each logic element provides only one tap, although any bit in the shift register can be tapped. For example, in the shift register of FIG. 13, multiplexer 200 can be controlled to provide any single bit in the shift register. However, shift registers in many user circuits require more than one tap. Therefore, it is desirable to provide a logic element that can provide more than one tap.

SUMMARY OF THE INVENTION

The invention provides a logic element for a programmable logic device (PLD) that can be configured as a shift register of variable length. An array of memory cells in the logic element is divided into two or more portions. The memory cells of each portion supply values to a corresponding output multiplexing circuit, thereby enabling the logic element to function as a lookup table by combining the outputs of the multiplexing circuits. However, each portion is also configurable as a shift register. The portions can function as separate shift registers, or can be concatenated to function as a single shift register. In some embodiments, the portions can also be concatenated with shift registers in other logic elements. One embodiment includes two portions. Other embodiments include more than two portions, and are therefore configurable as more than two shift registers.

Because two or more multiplexing circuits are available, two or more taps are provided, one from each portion of the memory array.

In one embodiment having a memory cell array divided into two portions, each portion has a configurable source for the shift in input. The first portion can be configured to accept a value from any of: a shift out value from the second portion of another logic element; a tap value read from the second portion of the other logic element; a value supplied by a source external to the logic element; and a value created by selecting between the values read from the first and second portions of the previous logic element. The second portion can be configured to accept a value from any of: a shift out value from the first portion of the same logic element; a tap value read from the first portion of the same logic element; and a value supplied by a source external to the logic element.

In one embodiment, the logic element is configurable as a lookup table and a shift register of configurable length. In another embodiment, the logic element is further configurable as a RAM. In another embodiment, the logic element is further configurable as a product term generator.

In some embodiments, the array of memory cells includes only one column, with that column being configurable as a 1-bit shift register. In other embodiments, the array includes two or more columns of memory cells, along with decode logic to select a single column from the array. In one such embodiment, only one column is used to implement the shift register, i.e., the shift register is one bit wide. In another embodiment, more than one or all rows of memory cells participate in the shift function, i.e., the shift register is more than one bit wide. In another embodiment, the columns of memory cells can be configurably concatenated to form a larger shift register within a single logic element.

BRIEF DESCRIPTION OF THE DRAWINGS

The present invention is illustrated by way of example, and not by way of limitation, in the following figures, in which like reference numerals refer to similar elements.

FIG. 1 is a schematic diagram of a first known memory cell used in a lookup table logic element.

FIG. 2 is a schematic diagram of a 4-input lookup table logic element using the memory cell of FIG. 1.

FIG. 3 is a detailed schematic diagram of a 2-input lookup table logic element using the memory cell of FIG. 1.

FIG. 4 is a schematic diagram of a second known memory cell used in a logic element configurable as a lookup table and a RAM.

FIG. 5 is a schematic diagram of a 4-input lookup table/16-bit RAM logic element using the memory cell of FIG. 4.

FIG. 6 is a detailed schematic diagram of a 2-input lookup table/4-bit RAM logic element using the memory cell of FIG. 4.

FIG. 11 is a schematic diagram of a 4-input lookup table/16-bit shift register/16-bit RAM logic element using the memory cell of FIG. 10.

DETAILED DESCRIPTION OF THE DRAWINGS

The present invention is believed to be applicable to a variety of programmable logic devices (PLDs). The present invention has been found to be particularly applicable and beneficial for logic elements in Field Programmable Gate Arrays (FPGAs). However, the present invention is not so limited. Further, in the following description, several exemplary logic elements are shown and described to provide a more thorough understanding of the present invention. However, it will be apparent to one skilled in the art that the present invention may be practiced in other logic elements and other programmable logic devices.

First Embodiment

Figure 9:
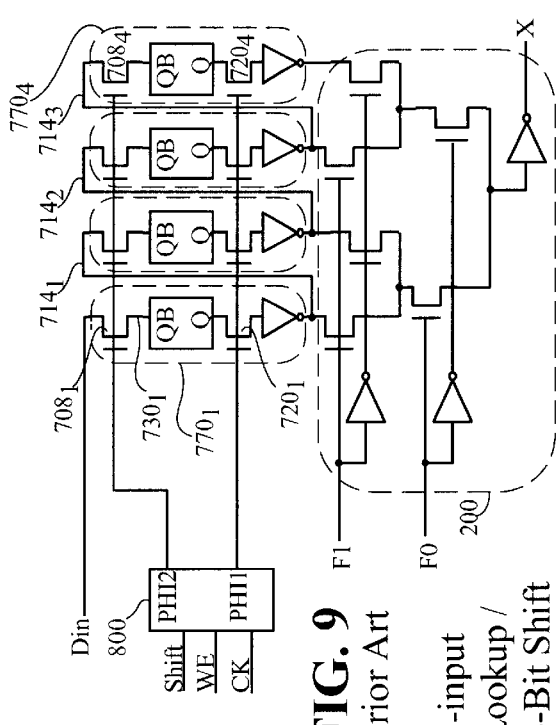
FIG. 9 is a detailed schematic diagram of a 2-input lookup table/4-bit shift register logic element using the memory cell of FIG. 7.
Figure 7:
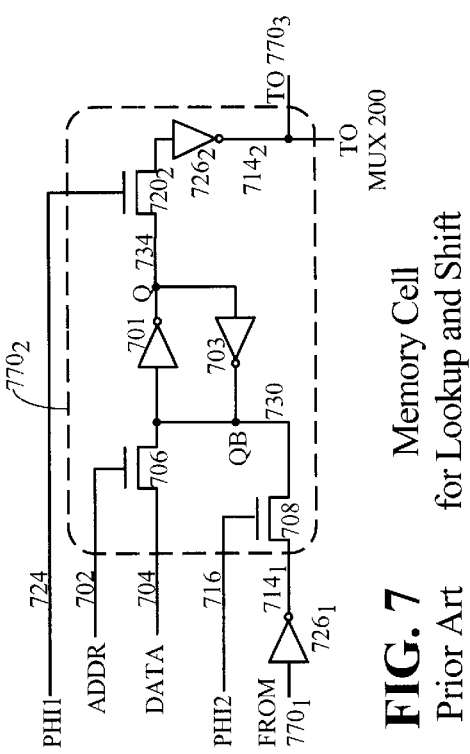
FIG. 7 is a schematic diagram of a third known memory cell used in a logic element configurable as a lookup table and a shift register.
Figure 8:
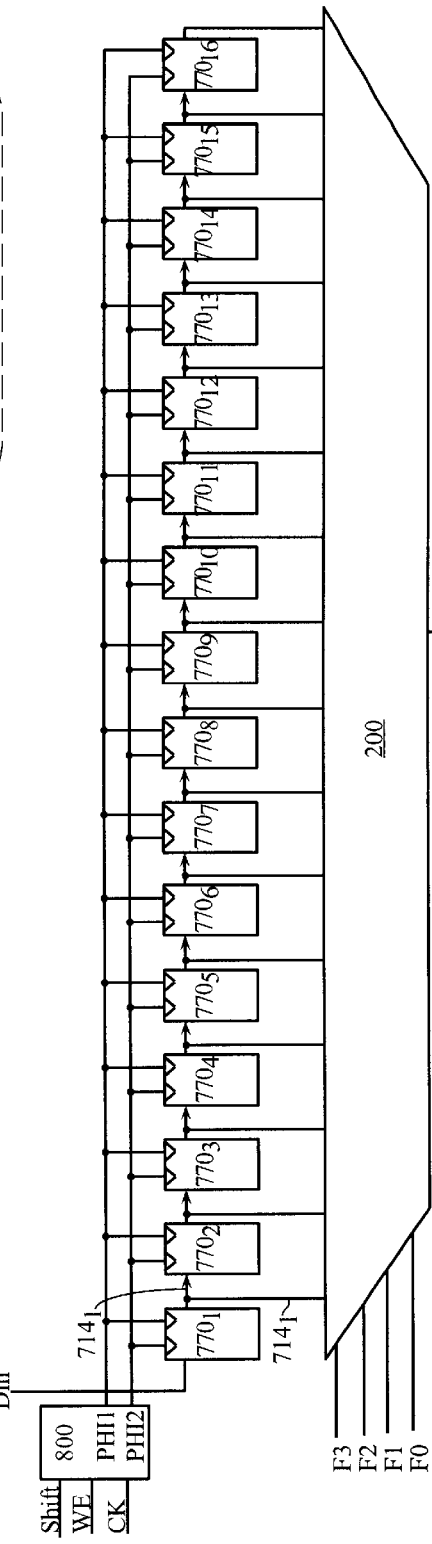
FIG. 8 is a schematic diagram of a 4-input lookup table/16-bit shift register logic element using the memory cell of FIG. 7.
Figure 14:
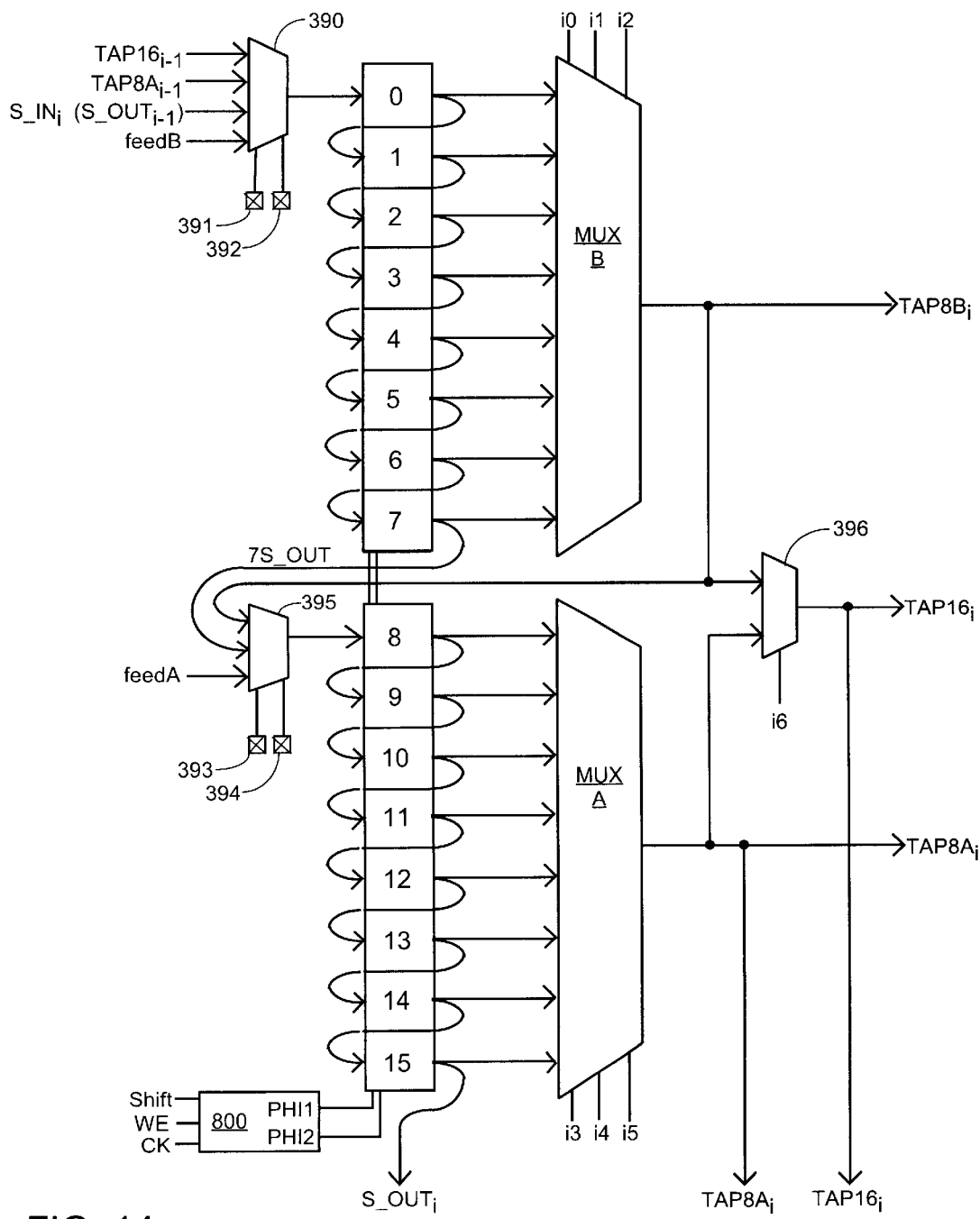
FIG. 14 is a block diagram of a first logic element according to a first embodiment that can be configured as a lookup table and a shift register of variable length.

FIG. 14 shows a first logic element 1400 that can be configured as a lookup table and a shift register of variable length. Logic element 1400 includes a column of memory cells 0–15. Memory cells 0–15 can be implemented, for example, in a manner similar to memory cell $770_2$ in FIG. 7. However, other memory cells having both lookup table and shift register capability can also be used.

Memory cells 0–7 are serially coupled to form a first 8-bit shift register, and each memory cell also provides a value to multiplexer MUXB. Multiplexer MUXE is controlled by input signals i0–i2, which are provided by a source external to the logic element. Multiplexer MUXB provides a selected tap value from one of memory cells 0–7 to output terminal $TAP8B_i$. Similarly, memory cells 8–15 are serially coupled to form a second 8-bit shift register, and each memory cell also provides a value to multiplexer MUXA. Multiplexer MUXA is controlled by input signals i3–i5, which are provided by a source external to the logic element. Multiplexer MUXA provides a selected tap value from one of memory cells 8–15 to output terminal $TAP8A_i$. The logic element of this embodiment also includes a multiplexer 396, which selects between the tap values provided by multiplexers MUXA and MUXB to provide another tap value to output terminal $TAP16_i$.

The shift in input to memory cell 0 is provided by multiplexer 390. In this embodiment, multiplexer 390 configurably selects among: the TAP16 signal from another logic element ($TAP16_{i-1}$); the TAP8A signal from the other logic element ($TAP8A_{i-1}$); the shift out value of memory cell 15 from the other logic element (S_OUT$_{i-1}$); and a value provided by a source external to the logic element (feedB). The selection is controlled by values stored in two configuration memory cells 391, 392.

The shift in input to memory cell 8 is provided by multiplexer 395. In this embodiment, multiplexer 395 configurably selects among: the TAP8B signal from the same logic element (TAP8B$_i$); the shift out value of memory cell 7 from the same logic element (7S_OUT); and a value provided by a source external to the logic element (feedA). The selection is controlled by values stored in two configuration memory cells 393, 394.

The shift register is controlled by control logic 800 that can, for example, use the non-overlapping two-phase clocking scheme described by Bauer. In one embodiment, Bauer's two-phase clocking scheme is used along with the memory cell shown in FIG. 7. However, other memory cells and other control logic circuits and methods can also be used.

By controlling the values stored in memory cells 391–394, the logic element can be configured to implement any of a single shift register, two shift registers, or a portion of a larger shift register. Because each portion of the memory cell array has a corresponding output multiplexer, each portion provides one shift register tap. By using selected subsets of the bits in the memory array, shift registers of various sizes and configurations can be implemented. By appropriately selecting the input signals i0–i6, a 16-bit lookup table can also be implemented. For example, if signals i0–i3 are the same as input signals i3–i5, a 4-bit lookup table is implemented, with the four input values being {i0/i3, i1/i4, i2/i5, i6}.

Figure 15:
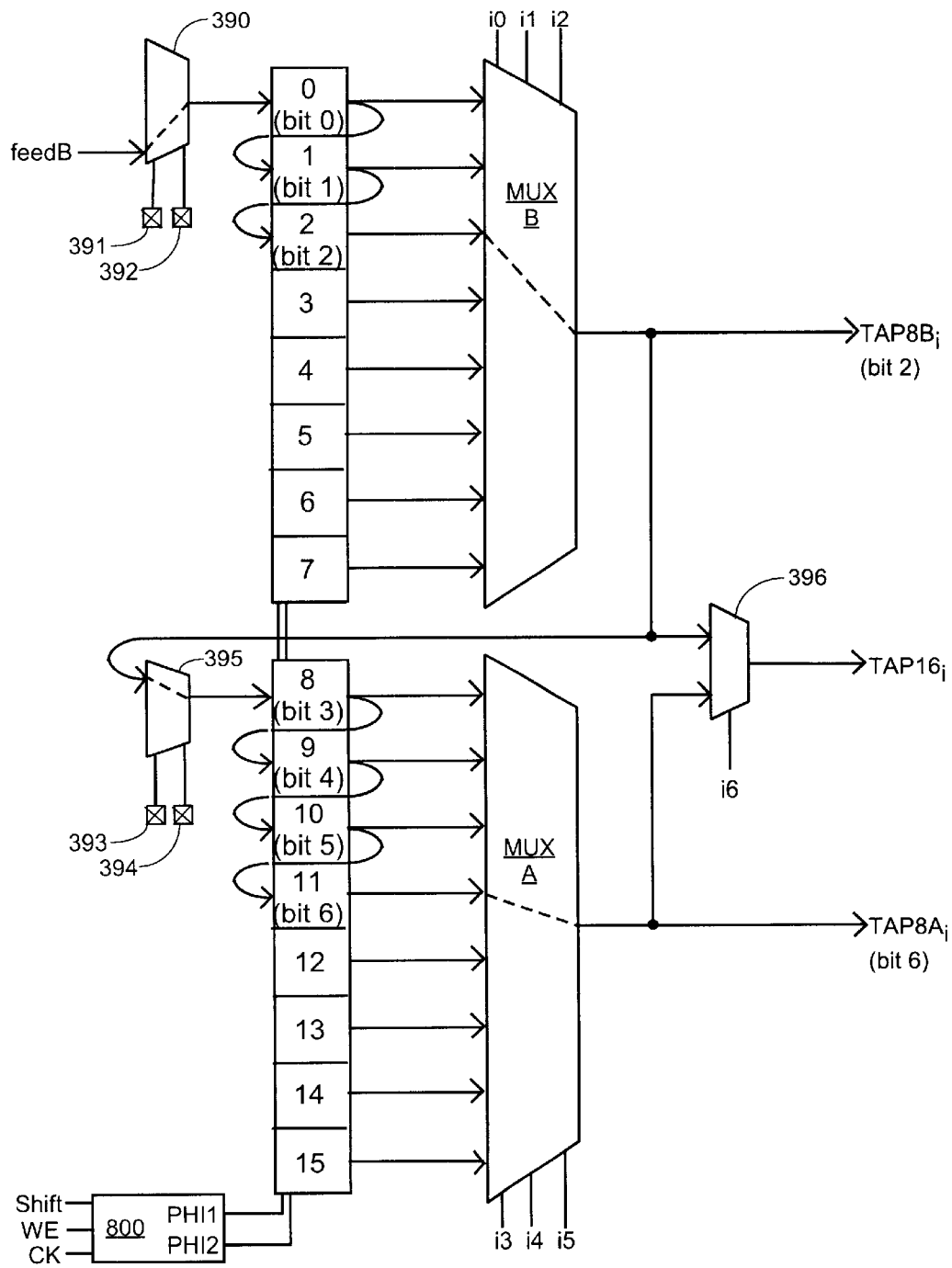
FIG. 15 is a exemplary 7-bit shift register with two taps, implemented in the logic element of FIG. 14.

FIG. 15 shows an exemplary shift register. The shift register is seven bits long (bits 0–6), and taps are needed at the third and seventh bits (bits 2 and 6). To implement the shift register using the logic element of FIG. 14, an input bit is provided to memory cell 0 at the feedB input terminal of multiplexer 390. The bit is shifted from memory cell 0, through memory cell 1 to memory cell 2, at which point the bit (bit 2, the third bit) is tapped through multiplexer MUXB and placed on the TAP8B$_i$ output terminal. The third bit is also provided to memory cell 8 by routing the TAP8B$_i$ output through multiplexer 395. The bit is then shifted from memory cell 8, through memory cells 9 and 10 to memory cell 11, at which point the bit (bit 6, the seventh bit) is tapped through multiplexer MUXA and placed on the TAP8A$_i$ output terminal.

In the example of FIG. 15, a 16-bit memory cell array is used to implement a 7-bit shift register. While the 7-bit shift register could be implemented in only half of the 16-bit array, to do so would limit the number of tap values to one, using the embodiment of FIG. 14. If the memory cell array were arranged as four 4-bit shift registers, rather than two 8-bit shift registers, the exemplary 7-bit, 2-tap shift register could be implemented more efficiently, using only half of the memory cell array. Such an arrangement also falls within the scope of the invention, which is not limited to any particular number of portions, any particular number of memory cells in a portion, or any particular size or aspect ratio of the memory cell array.

The more portions into which the memory cell array is divided, the more flexible the configurable shift register becomes. Carried to the extreme, this trend results in a string of flip-flops, with the output of each flip-flop being made available as a tap. However, this circuit requires much more area to implement than the logic element of FIG. 14, and renders the circuit unsuitable for implementing a PLD lookup table.

Second Embodiment

Figure 16:
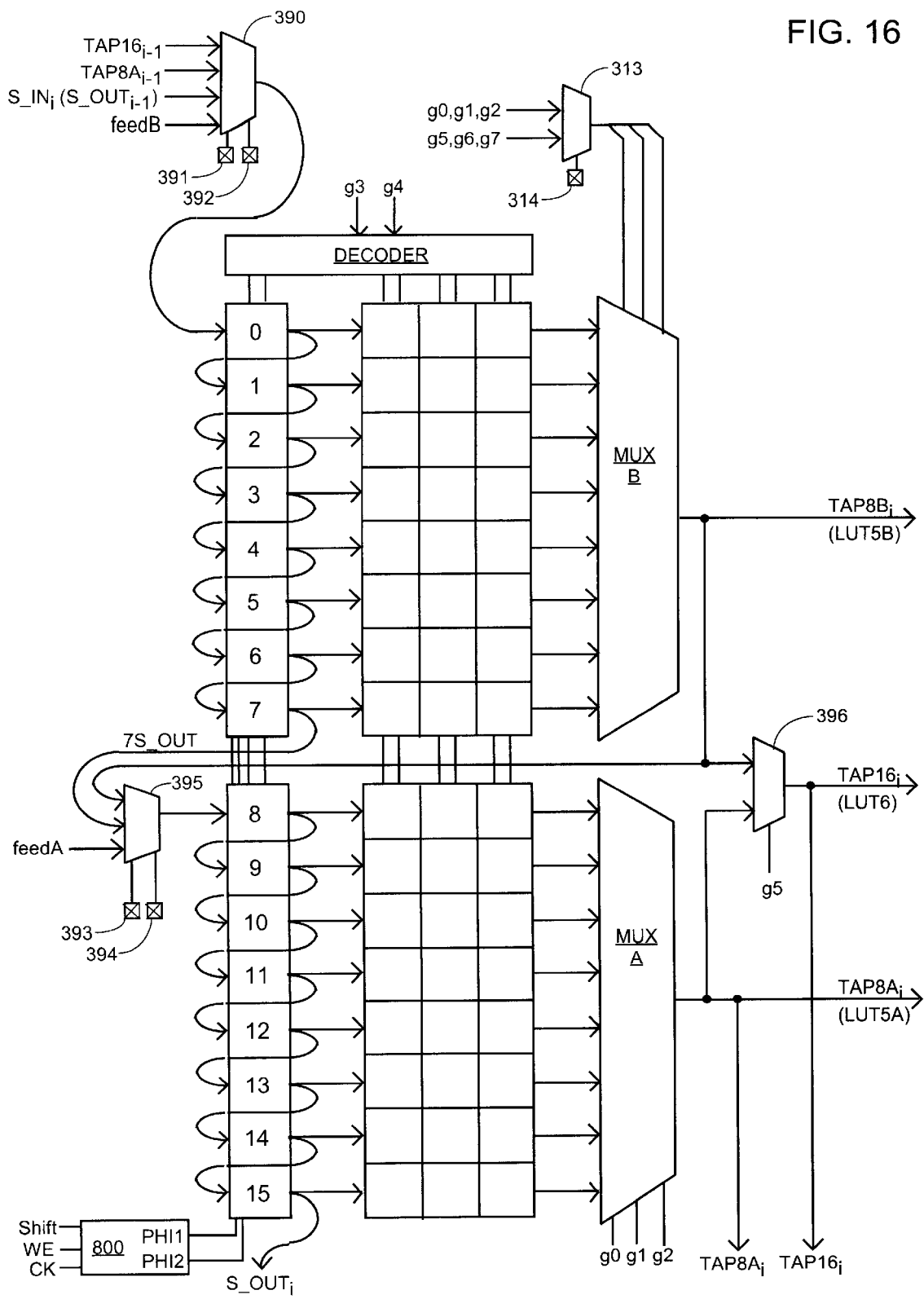
FIG. 16 is a block diagram of a second logic element according to a second embodiment that can be configured as a lookup table and a shift register of variable length.

FIG. 16 shows a second logic element that can be configured as a lookup table and a shift register of variable length. Many of the features of this embodiment are the same as that of FIG. 14, therefore, only the differences are described.

The logic element of FIG. 16 includes a memory cell array having four columns of 16 memory cells each, of which one column is configurable as a shift register as in the exemplary logic element of FIG. 14. Two input signals g3 and g4 are decoded in the DECODER circuit, and these signals select among the four columns of memory cells. Additional input signals control the multiplexers MUXA and MUXB to select from among the rows of memory cells.

The logic element of FIG. 16 has several different operating modes. In a first operating mode, called the LUT5 mode, the logic element is configured as two 5-input lookup tables (LUTs), with the outputs being provided at output terminals TAP8A$_i$ and TAP8B$_i$. In the LUT5 mode, multiplexer MUXB is controlled by input signals g5, g6, and g7. This selection is made by programming configuration memory cell 314, which controls multiplexer 313 to pass input signals g5–g7 to control multiplexer MUXB. Multiplexer MUXA is controlled by input signals g0, g1, and g2. The decoder circuit is controlled by two input signals g3 and g4, which are therefore shared between the two 5-input LUTs.

In a second operating mode, called the LUT6 mode, configuration memory cell 314 is programmed to pass inputs g0–g2 to control multiplexer MUXB. Therefore, both multiplexers MUXA and MUXB are controlled by shared input signals g0–g2. The decoder circuit is controlled by two shared input signals g3 and g4. A sixth input signal g5 is used to control multiplexer 396, and the output of the 16-input lookup table is provided at the output terminal TAP16$_i$ of multiplexer 396.

In a third operating mode, one column of the memory array functions as a shift register, as described in connection with FIG. 14. The shift functionality of the shift register is controlled by control logic 800 that can, for example, use the non-overlapping two-phase clocking scheme described by Bauer. In one embodiment, Bauer's two-phase clocking scheme is used for the cells in the first column along with the memory cell shown in FIG. 7. The cells in the remaining three columns do not need to receive the clocks, as they do not participate in the shift. In other embodiments, a single clock signal is used to shift the values in the shift register.

Third Embodiment

Figure 17:
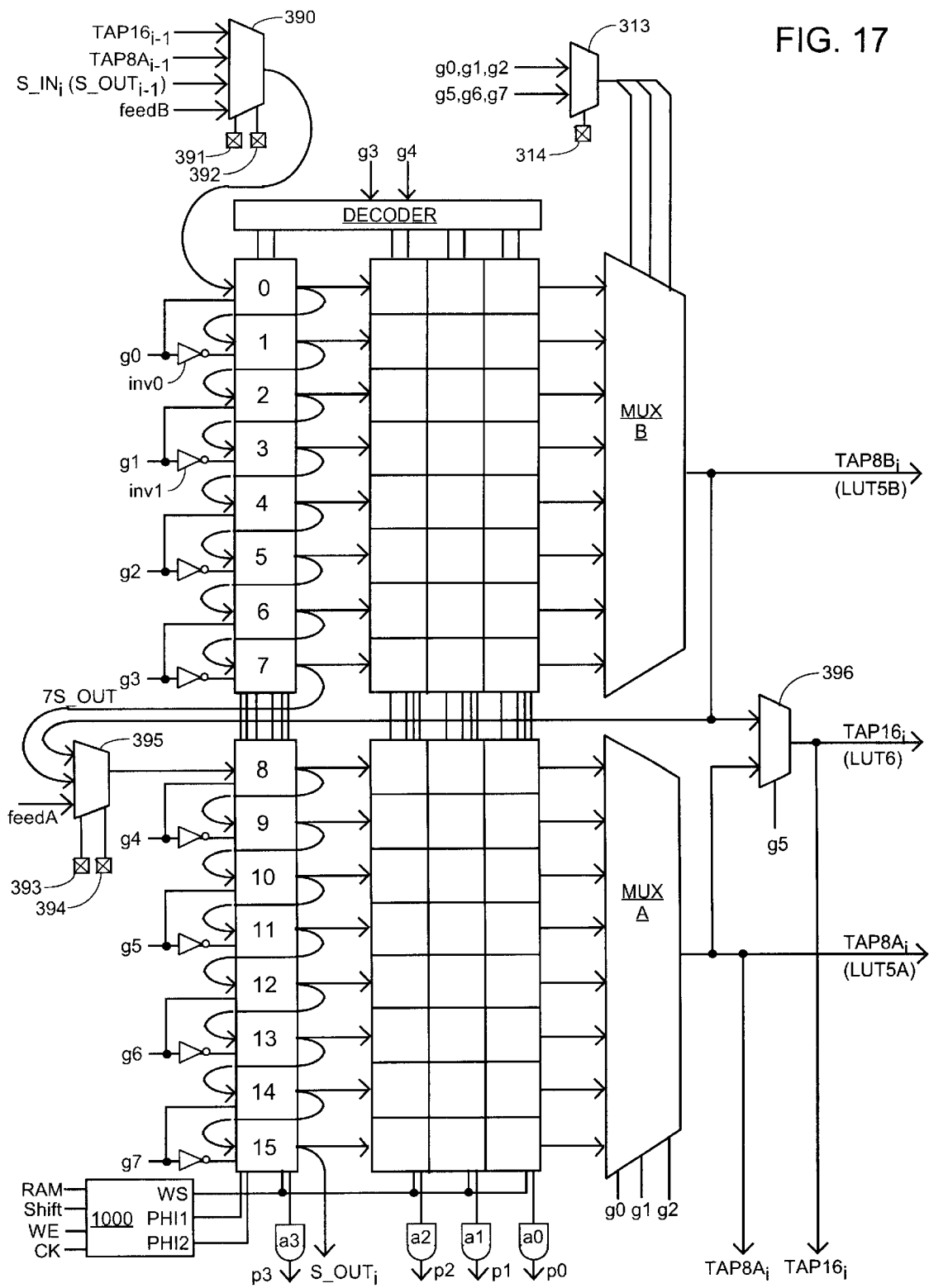
FIG. 17 is a block diagram of a logic element according to a third embodiment that can be configured as a lookup table, a RAM, a product term generator, and a shift register of variable length.

FIG. 17 shows a logic element that can be configured as a lookup table, a RAM, a product term generator, and a shift register of variable length. Many of the features of this embodiment are the same as that of FIG. 16, therefore, only the differences are described.

Figures 10, 12:
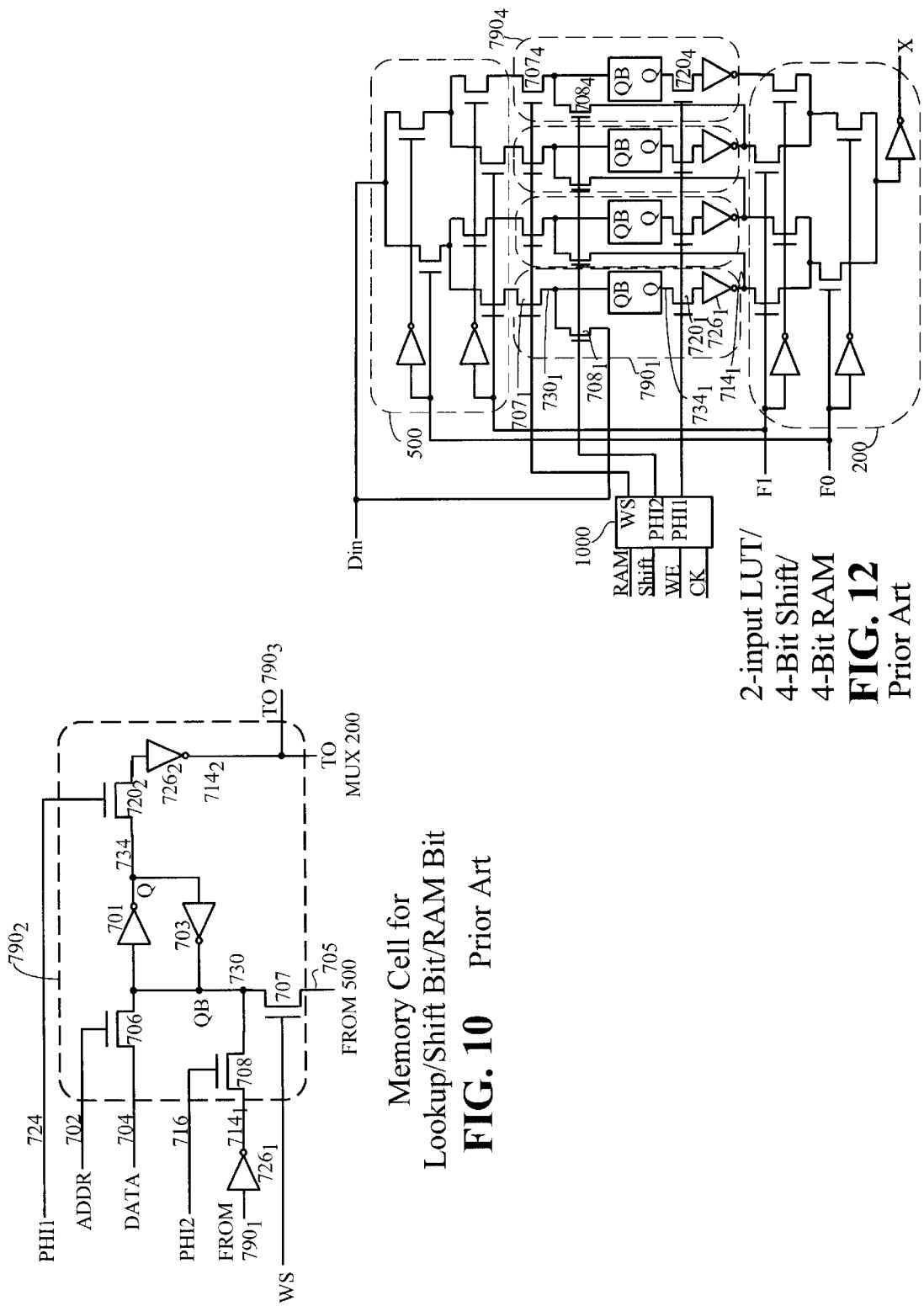
FIG. 10 is a schematic diagram of a fourth known memory cell used in a logic element configurable as a lookup table, a shift register, and a RAM.
FIG. 12 is a detailed schematic diagram of a 2-input lookup table/4-bit shift register/4-bit RAM logic element using the memory cell of FIG. 10.
Figure 13:
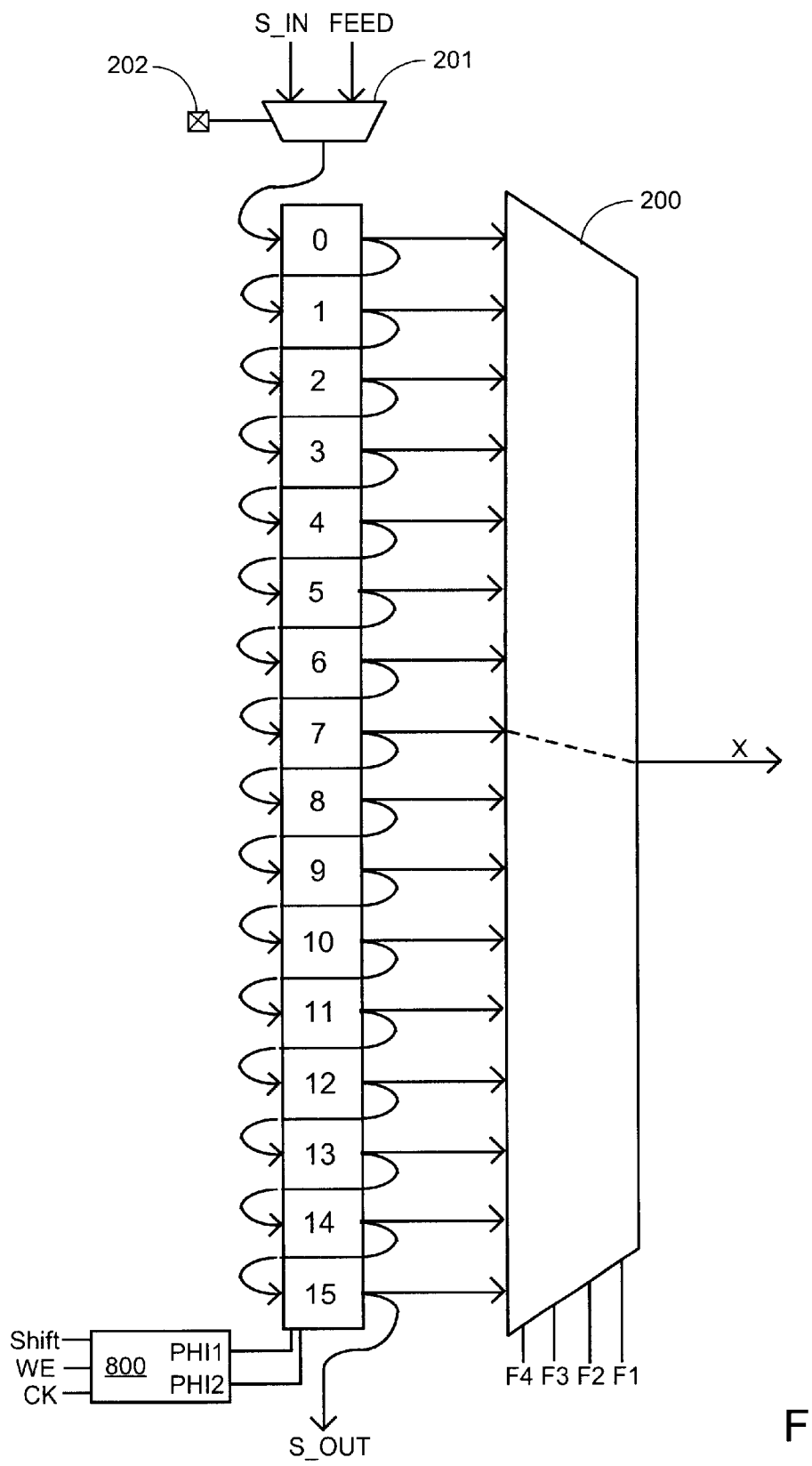
FIG. 13 is a block diagram of a known logic element configurable as a cascadable shift register.

The memory cells in the logic element of FIG. 17 have RAM capability, and the data is provided to the RAM cells by applying data to the g0–g7 input terminals and strobing the RAM control signal. The signal on the g0 input terminal is applied to the first row, and the inverse signal (inverted by inverter invO) is applied to the second row. These input signals are applied, for example, to DATA input terminals similar to those of the Lookup/Shift/RAM memory cell shown in FIG. 10. Similarly, the signal on the g1 terminal is applied to the third row, while the inverse signal is applied to the next row, and so forth. Control block 1000 provides a write strobe (WS) signal to each column in the memory array, and the write operation is performed on the column selected by the decoder. Control block 1000 can, for example, be similar to control block 1000 of FIG. 10, described by Bauer.

The memory cells also have lookup table and shift register capabilities similar to those of the embodiment of FIG. 16.

In addition, the logic element shown in FIG. 17 can be configured as a product term generator. AND gates a0–a3 combine the values stored in the memory cells of the associated columns to generate four product terms p0–p3, respectively. Several memory cells that can be used in the embodiment of FIG. 17 are described by Wittig et al. in U.S. Pat. No. 6,150,838, entitled "FPGA Configurable Logic Block With Multi-Purpose Logic/Memory Circuit".

As has been seen by these examples, the configurable shift register capability of the invention can be optionally combined with many other capabilities in a logic element for a programmable logic device.

Fourth Embodiment

While the previous examples show a memory array wherein only one column in the array functions as a shift register, in other embodiments more than one column can participate in the shift function.

Figure 18:
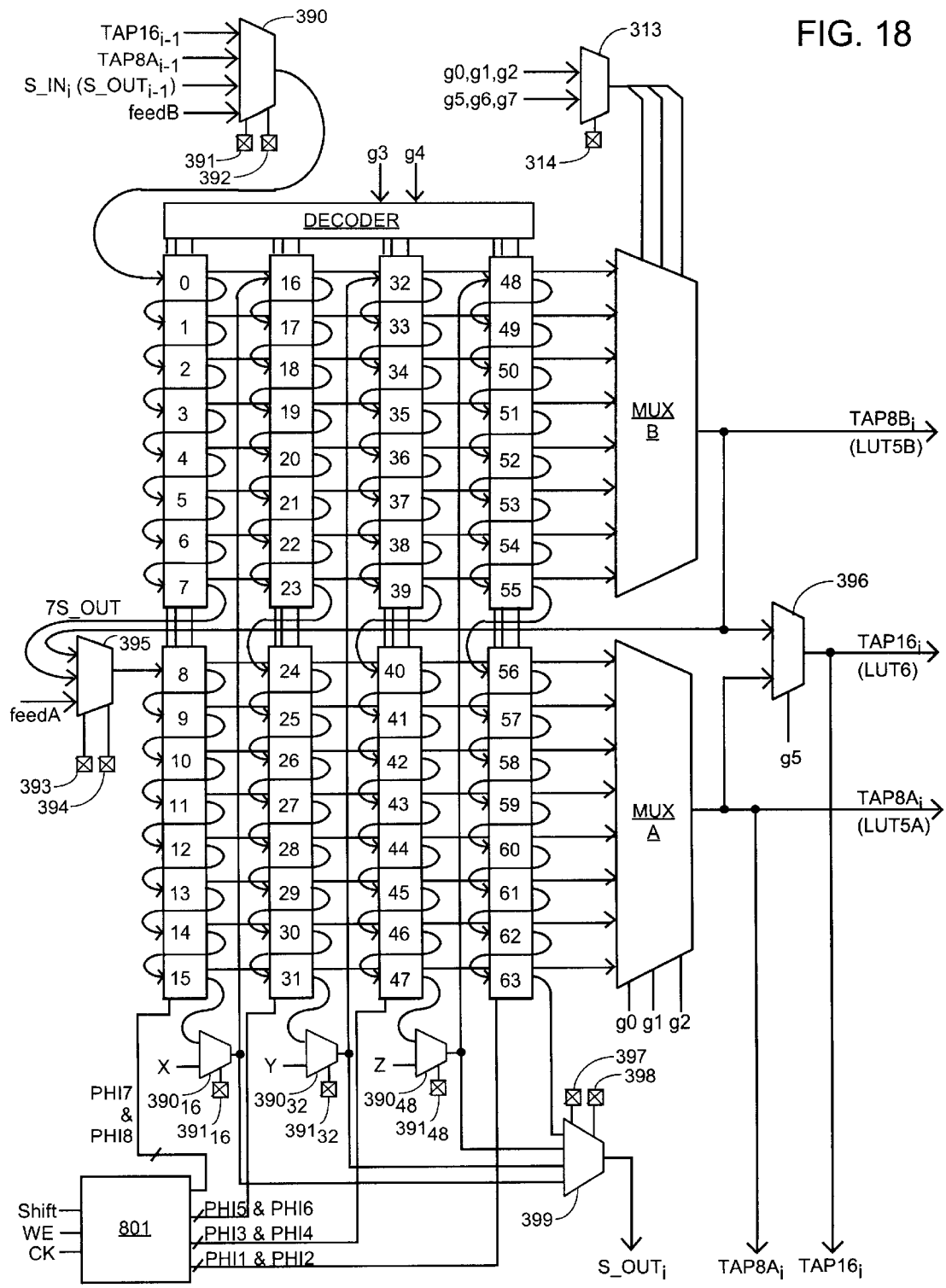
FIG. 18 is a block diagram of a logic element according to a fourth embodiment that can be configured as a lookup table and a multi-column shift register.

FIG. 18 shows a logic element having a multi-column RAM array, where the logic element can be configured as a shift register that uses all columns of the array, coupled in series. This embodiment is similar to that of FIG. 16, except that all columns participate and the clocking scheme is adapted to allow this participation.

Because the columns in the memory array are addressed by decoder, only one column can be written at one time. Therefore, to write data to all columns of the array (i.e., to shift data one bit through each memory cell in all columns of the array), either the decoder must be altered to select all columns at one time during the shift operation (which is easily done by those of ordinary skill in the art) or the columns must be shifted sequentially. To avoid overwriting data in the next column, the fourth column is shifted first, then the third column, and so forth. This sequential shift is easily accomplished by using an eight-phase clocking scheme, as shown in FIG. 18. In the pictured embodiment, the eight clocks PHI1–PHI8 are also supplied to the decoder, so the decode lines can be activated with the correct timing to match the clock signals.

In the embodiment of FIG. 18, bit 0 and bit 8 are feed points (i.e., new bit values can be shifted in at these points). Additionally, at bits 16, 32, and 48, new data X, Y, Z can optionally be shifted in via multiplexers 390$_{16}$, 390$_{32}$, and 390$_{48}$, respectively. Data X, Y, Z can, for example, by provided from tap points in other memory cells, tap points in the same memory cell, or sources external to the logic element. In other embodiments (not shown), other bits are also feed points. In one embodiment, bits 0, 8, 16, 24, 32, 40, 48, and 56 are feed points.

In another embodiment (not shown) two or more bits in each row of the array participate in the shift, but in parallel rather than in series. A logic element having this capability would be very useful in implementing multi-bit FIF0s, for example. In one such embodiment, there are two or more multiplexers 395, each feeding one memory cell in one column. As in the embodiment of FIG. 18, two or more columns are addressed to perform the shift, either at the same time (e.g., by altering the decode logic) or in sequence (e.g., by using an eight-phase clock).

In another embodiment (not shown) the columns in the top half of the memory array are programmably concatenated, and the columns in the bottom half of the memory array are also programmably concatenated. Therefore, two shift registers of up to 32 bits can be implemented in a single logic element, with the two outputs being provided through the multiplexers A,B.

Figure 19:
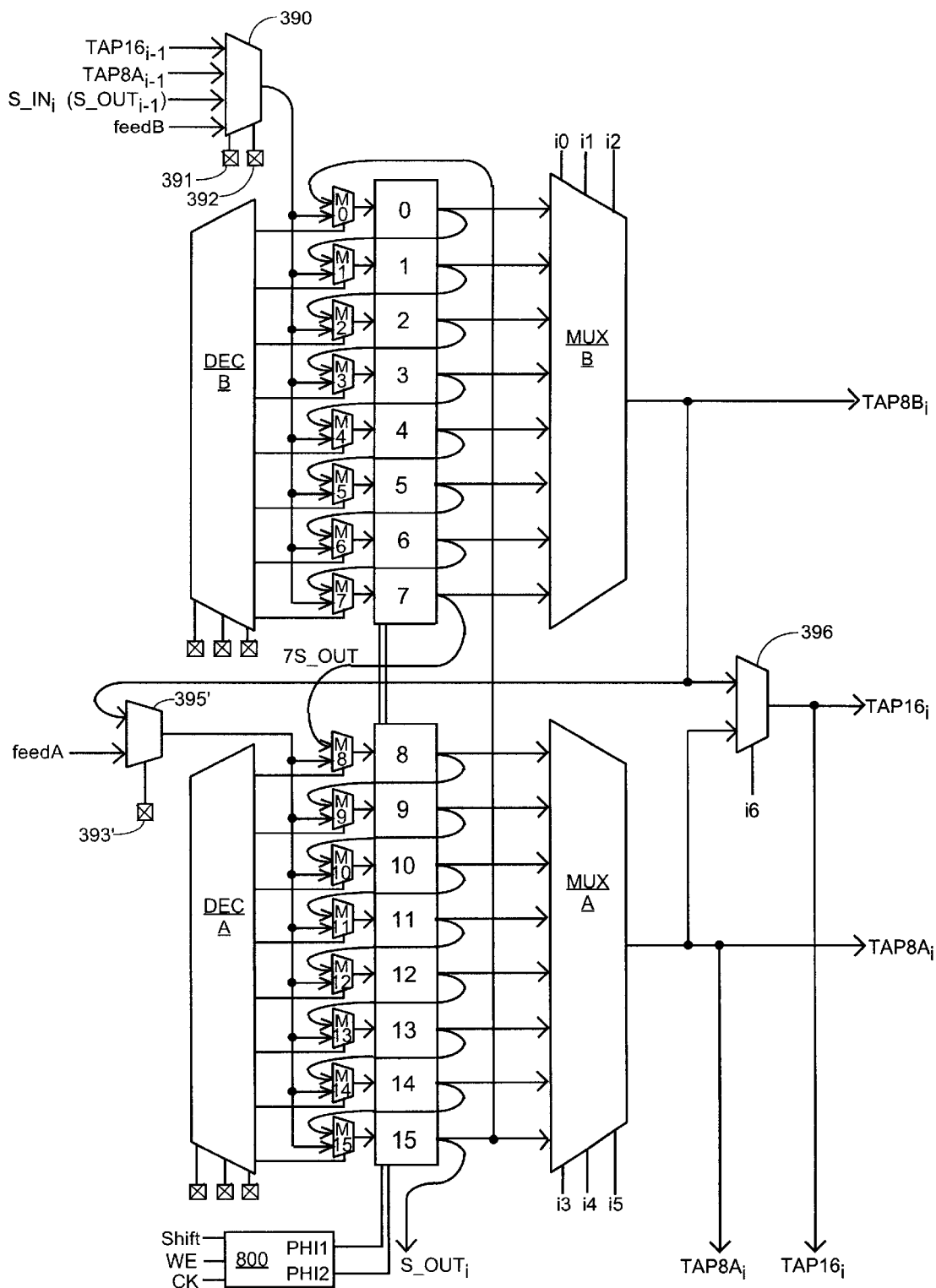
FIG. 19 is a block diagram of a logic element according to a fifth embodiment that is particularly suited to the implementation of linear feedback shift registers (LFSRs).

FIG. 19 shows a logic element having a single-column RAM array, where the logic element can be configured as a shift register where each bit is write-accessible. This embodiment is particularly suited to the implementation of linear feedback shift registers (LFSRs), which often require long shift registers with closely spaced taps. This embodiment is similar to that of FIG. 14, therefore, only the differences are described.

As shown in FIG. 19, when in shift register mode, each memory cell 0–15 in the RAM array receives either the shift in bit from the previous memory cell or the bit provided through the corresponding multiplexer 390, 395'. This selection is made via multiplexers M0–M15, which are controlled by the corresponding decoder DECA, DECB. In this mode, decoders DECA and DECB are controlled by configuration memory cells. Thus, by properly controlling the corresponding input signals, any bit in the top half of the RAM array can be written with the output of multiplexer 390, and any bit in the bottom half of the RAM array can be written with the output of multiplexer 395'.

Another feature of this embodiment is that the output of memory cell 15 is optionally fed back through multiplexer M0 to memory cell 0.

Those having skill in the relevant arts of the invention will now perceive various modifications and additions that may be made as a result of the disclosure herein. For example, memory cells, arrays, inverters, pass transistors, clocking schemes, control circuits, clocking circuits, decoders, multiplexers and multiplexing circuits, addressing circuits, configuration memory cells, shift registers, lookup tables, RAMs, product term generator circuits, and programmable logic devices other than those described herein can be used to implement the invention.

Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A logic element for a Programmable Logic Device (PLD), comprising:

an array of memory cells;

a first multiplexing circuit;

a first plurality of memory cells in the array, each memory cell having a shift in terminal and a shift out terminal, with the shift out terminal of one memory cell being coupled to the shift in terminal of a next memory cell, thereby forming a first shift register having a first memory cell and a last memory cell, wherein each memory cell in the first shift register provides a data value stored in the memory cell to the first multiplexing circuit, and wherein the last memory cell in the first shift register provides a first shift register out signal;

a second multiplexing circuit;

a second plurality of memory cells in the array, each memory cell having a shift in terminal and a shift out terminal, with the shift out terminal of one memory cell being coupled to the shift in terminal of a next memory cell, thereby forming a second shift register having a first memory cell and a last memory cell, wherein each memory cell in the second shift register provides a data value stored in the memory cell to the second multiplexing circuit, and the last memory cell in the second shift register provides a second shift register out signal; and a third multiplexing circuit providing a signal to the shift in terminal of the first memory cell in the second shift register, the third multiplexing circuit selecting at least between the first shift register out signal and an output of the first multiplexing circuit.

2. The logic element of claim 1, wherein the first and second multiplexing circuits are controlled by signals applied from a source external to the logic element.

3. The logic element of claim 1, wherein the third multiplexing circuit is controlled by a configuration memory cell.

4. The logic element of claim 1, wherein the third multiplexing circuit selects between the first shift register out signal, the output of the first multiplexing circuit, and a signal applied from a source external to the logic element.

5. The logic element of claim 1, further comprising:

a fourth multiplexing circuit providing a signal to the shift in terminal of the first memory cell in the first shift register, the fourth multiplexing circuit selecting at least between the second shift register out signal of another logic element and an output of the second multiplexing circuit in the another logic element.

6. The logic element of claim 5, wherein the fourth multiplexing circuit is controlled by a configuration memory cell.

7. The logic element of claim 5, wherein the fourth multiplexing circuit selects between the second shift register out signal of another logic element, the output of the second multiplexing circuit in the another logic element, and a signal applied from a source external to the logic element.

8. The logic element of claim 5, further comprising a fifth multiplexing circuit selecting between the output of the first multiplexing circuit and the output of the second multiplexing circuit, wherein the fourth multiplexing circuit selects at least between the second shift register out signal of the another logic element, the output of the second multiplexing circuit in the another logic element, and an output of the fifth multiplexing circuit in the another logic element.

9. The logic element of claim 8, wherein the fifth multiplexing circuit is controlled by a signal applied from a source external to the logic element.

10. The logic element of claim 8, wherein the fourth multiplexing circuit selects between the second shift register out signal of the another logic element, the output of the second multiplexing circuit in the another logic element, the output of the fifth multiplexing circuit in the another logic element, and a signal applied from a source external to the logic element.

11. The logic element of claim 1, further comprising:

a fourth multiplexing circuit providing a signal to the shift in terminal of the first memory cell in the first shift register, the fourth multiplexing circuit selecting at least between the second shift register out signal and a second shift register out signal of another logic element.

12. A logic element for a programmable logic device (PLD), the logic element comprising:

an array of memory cells arranged in rows and at least one column, the column being divided into first and second portions each comprising a plurality of rows of memory cells;

a first addressing circuit for selecting a row from the first portion of the column; and a second addressing circuit for selecting a row from the second portion of the column, wherein:

the first portion of the column is configurable as an n-bit shift register, the second portion of the column is configurable as an m-bit shift register, and the column is configurable as an (n+m)-bit shift register.

13. The logic element of claim 12, wherein the array of memory cells comprises a plurality of columns, the logic element further comprising a third addressing circuit for selecting a column of the array.

14. The logic element of claim 13, wherein the n-bit, m-bit, and (n+m)-bit shift registers comprise additional columns of the array.

15. The logic element of claim 12, wherein the logic element is configurable as a RAM.

16. The logic element of claim 12, further comprising a product term generator circuit, and the logic element is configurable as a product term generator.

17. The logic element of claim 12, wherein n and m are equal.

18. A logic element for a programmable logic device (PLD), the logic element comprising:

an array of memory cells arranged in rows and at least one column, the column being divided into first and second portions each comprising a plurality of rows of memory cells;

a first multiplexing circuit for selecting a row from the first portion of the column and reading a value therefrom; and a second multiplexing circuit for selecting a row from the second portion of the column and reading a value therefrom, wherein:

the first portion of the column is configurable as an n-bit shift register, the second portion of the column is configurable as an m-bit shift register having as a shift in input the value read from the first portion of the column, and the second portion of the column is further configurable as an m-bit shift register having as a shift in input a value shifted out of the first portion of the column.

19. The logic element of claim 18, wherein n and m are equal.

20. The logic element of claim 18, wherein the second portion of the column is further configurable as an m-bit shift register having as a shift in input a value supplied by a source external to the logic element.

21. The logic element of claim 18, wherein:

the first portion of the column is further configurable as an n-bit shift register having as a shift in input a value shifted out of the second portion of the column in another logic element.

22. The logic element of claim 18, wherein:

the first portion of the column is further configurable as an n-bit shift register having as a shift in input a value read from the second portion of the column in another logic element.

23. The logic element of claim 18, wherein:

the first portion of the column is further configurable as an n-bit shift register having as a shift in input a value supplied by a source external to the logic element.

24. The logic element of claim 18, further comprising a third multiplexing circuit selecting between the value read from the first portion of the column and the value read from the second portion of the column, wherein the first portion of the column is further configurable as an n-bit shift register having as a shift in input the value selected by the third multiplexing circuit of another logic element.

25. The logic element of claim 24, wherein the first portion of the column is further configurable as an n-bit shift register having as a shift in input a value read from the second portion of the column in the another logic element.

26. The logic element of claim 24, wherein the first portion of the column is further configurable as an n-bit shift register having as a shift in input a value shifted from the second portion of the column in the another logic element.

27. The logic element of claim 24, wherein the first portion of the column is further configurable as an n-bit shift register having as a shift in input a value supplied by a source external to the logic element.

28. The logic element of claim 18, wherein:

the column is configurable as an (n+m)-bit shift register having as a shift in input a value shifted out of the second portion of the column in another logic element.

29. The logic element of claim 18, wherein:

the column is configurable as an (n+m)-bit shift register having as a shift in input a value read from the second portion of the column in another logic element.

30. The logic element of claim 18, wherein:

the column is configurable as an (n+m)-bit shift register having as a shift in input a value supplied by a source external to the logic element.

* * * * *